United States Patent
Chen

(10) Patent No.: US 7,123,478 B2
(45) Date of Patent: Oct. 17, 2006

(54) ELECTRONIC PRODUCT HAVING AIRFLOW-GUIDING DEVICE

(75) Inventor: Yu-Lin Chen, Pan Chiao (TW)

(73) Assignee: Quanta Computer, Inc., Taoyuan Shien (TW)

( * ) Notice: Subject to any disclaimer, the term of this patent is extended or adjusted under 35 U.S.C. 154(b) by 67 days.

(21) Appl. No.: 10/872,363

(22) Filed: Jun. 22, 2004

(65) Prior Publication Data
US 2005/0083653 A1   Apr. 21, 2005

(30) Foreign Application Priority Data
Oct. 21, 2003   (TW) .............................. 92129201 A

(51) Int. Cl.
*H05K 7/20*   (2006.01)

(52) U.S. Cl. ...................... 361/695; 174/16.1; 454/184

(58) Field of Classification Search ................ 361/687, 361/690–695, 715–716, 719–720; 174/16.1, 174/16.3; 165/80.3, 104.33, 122; 454/184
See application file for complete search history.

(56) References Cited

U.S. PATENT DOCUMENTS

| | | | | |
|---|---|---|---|---|
| 5,375,038 A | * | 12/1994 | Hardt | ......................... 361/694 |
| 6,031,717 A | * | 2/2000 | Baddour et al. | ............ 361/687 |
| 6,333,851 B1 | * | 12/2001 | Shih | ............................ 361/695 |
| 6,359,779 B1 | * | 3/2002 | Frank et al. | ................. 361/687 |
| 6,400,568 B1 | * | 6/2002 | Kim et al. | ................... 361/697 |
| 6,504,718 B1 | * | 1/2003 | Wu | ............................. 361/695 |
| 6,795,314 B1 | * | 9/2004 | Arbogast et al. | ........... 361/695 |
| 2004/0032716 A1 | * | 2/2004 | Roan | ........................... 361/687 |

FOREIGN PATENT DOCUMENTS

| TW | 481302 | 11/1989 |
|---|---|---|
| TW | 505269 | 3/1990 |

* cited by examiner

*Primary Examiner*—Boris Chervinsky
(74) *Attorney, Agent, or Firm*—Rabin & Berdo, PC

(57) ABSTRACT

An electronic product (for example: an industrial computer) having an airflow-guiding device is disclosed, thereby preventing most of the airflow from being carried away by power supplies, wherein most of the air flow directed towards the power supplies will result in other electronic modules failing to have proper heat-dissipation. The present invention is to install metal partition plates on the inlets of air passages among the power supplies, fan modules and both sides of the electronic modules in the electronic product, wherein each of the meal partition plate is composed of a partition main body; folded plated respectively connected to two opposite sides of the partition main body; and buffer elements (for example: sponge pads) covering portions of the other two opposite sides of the partition main body.

20 Claims, 4 Drawing Sheets

ELECTRONIC PRODUCT HAVING AIRFLOW-GUIDING DEVICE

FIELD OF THE INVENTION

The present invention relates to an electronic product having an airflow-guiding device, and more particularly, to the electronic product effective using airflow for heat dissipation by preventing most of the airflow from being carried away by power supplies.

BACKGROUND OF THE INVENTION

It is a common technique to use fans in various industrial equipments for heat dissipation, especially in widely used electronic products. With the increase of various applications, the number of electronic modules installed in one single electronic product also increases. Based on the design consideration of space, the electronic modules are usually stacked vertically in a housing of an electronic product. For example, there are quite many electronic modules (such as storage controllers) existing in an industrial computer or server. For the considerations of providing sufficient power to the electronic modules and providing backup power source, the electronic product such as an industrial computer or a server frequently needs installing two or more power supplies so as to satisfy the specific requirements of the aforementioned electronic products.

On the other hand, since the number of the electronic modules is quite a few, a plurality of fan modules (such as four fan modules) have to be installed in the electronic product, thereby effectively resolving the heat-dissipation problem of the electronic modules. Generally speaking, the system fan modules in the electronic product are exposed to the ambiance so as to dissipate the heat to the ambiance, and each of the power supplies has a fan for dissipating its own heat, wherein the power supplies are located behind the system fan modules. When the fans of the power supplies and the system fan modules are working at the same time, the air pressures in the areas of power supplies are usually lower than those in the areas of other electronic modules, so that most of the airflow flows naturally into the power supplies after entering the housing of the electronic product from the ambiance, resulting in the other electronic modules lacking of airflow passing through. Thus, the heat-dissipation efficiency of the system fan modules decreases and the over-heat problem is seriously in the electronic modules. In other words, the fans of the power supplies carry away most of the airflow in the housing, thus resulting in the electronic modules failing to have effective heat-dissipation.

Commonly, a conventional technique uses a wind-shielding partition designed with a plastic member to prevent airflow from flowing into the power supplies. However, the conventional plastic wind-shielding partition costs quite a lot of molding expense, and has the difficulty of design modification. Additionally, the mechanism for assembling the conventional wind-shielding partition with the housing of the electronic product is quite complicated, so that the disassembling and assembling steps cannot be briefly done, and also the wind-shielding partition is frequently damaged thereby. Moreover, the power supplies and the electronic modules all need proper amounts of airflow flowing therein, but it is very difficult to distribute airflow flexibly with the conventional plastic wind-shielding partition, i.e. the conventional plastic wind-shielding partition has poor airflow-guiding effect.

Hence, there is a need to develop a housing of an electronic product having an air-flow guiding device, thereby promoting heat-dissipation efficiency; lowering the cost for fabricating partitions; lowering the difficulty level of processing a design change; flexibly distributing airflow to increase airflow-guiding effect; and simplifying the mechanism for assembling a metal plate partition with the housing of the electronic product, thus briefly disassembling and assembling the metal plate partition.

SUMMARY OF THE INVENTION

It is an object of the present invention to provide an electronic product having an airflow-guiding device for lowering the cost for fabricating partitions and lowering the difficulty level of processing a design change.

It is another object of the present invention to provide an electronic product having an airflow-guiding device for flexibly distributing airflow so as to increase airflow-guiding effect.

It is another object of the present invention to provide an electronic product having an airflow-guiding device for simplifying the mechanism for assembling a metal plate partition with the housing of the electronic product, so as to briefly disassemble and assemble the metal plate partition.

According to the aforementioned objects of the present invention, the present invention provides an electronic product having an airflow-guiding device.

According to a preferred embodiment of the present invention, the electronic product having the airflow-guiding device comprises: a housing body, an electronic module group located in the housing body; at least one power supply, at least one system fan module, and at least one metal plate partition. The power supply is located in at least one passage between the electronic module group and the housing body. The system fan module is located on one end of the housing body and exposed to the ambience, and is used for introducing the ambient airflow into the housing body, thereby providing the heat-dissipation function for the electronic module group. The metal plate partition is installed on an air inlet of the passage facing towards the system fan module, thereby reducing the air flowing from the system fan module into the power supply.

Further, the metal plate partition comprises: a partition main body, a first folded plate and a second folded plate. The partition main body has a first side and a second side opposite to each other, and has a first main surface and a second main surface opposite to each other. The first folded side and the second folded side are connected to the first side and the second side respectively, wherein the first folded plate is fixed to a module sidewall of the electronic module group, and the second folded plate is fixed to a housing sidewall of the housing body. There is a first folded plate angle between the first folded plate and the first main surface, and there is a second folded plate angle between the second folded plate and the second main surface, wherein the first folded plate angle and the second folded plate angle are greater than 0 degrees and smaller than 180 degrees.

Further, the metal plate partition comprises: a fin plate connected to one side of the second folded plate opposite to the second side. There is a fin plat angle between the fin plate and a folded plate surface of the second folded plate facing towards the partition main body, wherein the fin plate angle is greater than 0 degrees and smaller than 180 degrees.

Further, the metal plate partition comprises: at least one buffer element (such as a sponge pad), wherein the buffer element covers portions of two opposite sides of the partition main body adjacent to the first side and the second side, thereby allowing a proper amount of air to flow into the power supply.

Further, the aforementioned first folded plate has: an opening located in the first folded plate, and a pair of shallow concaved portions. The opening is used to engage with a clipping structure located on the module sidewall. The shallow concaved portions are located respectively on two sides of the first folded plate adjacent to the partition main body, wherein one of the shallow concaved portions is used to kook up with another clipping structure located on the module sidewall.

Further, the aforementioned second folded plate has a pair of deep concaved portions. The deep concaved portions are located on two sides of the second folded plate adjacent to the partition main body, wherein one of the deep concaved portions is used to engage with at least one guiding pillar located on the housing sidewall.

Hence, with the application of the present invention, the fabrication cost of partitions and the difficulty level of processing a design change can be lowered; the airflow can distributed flexibly, thus enhancing the airflow-guiding effect; and the mechanism for assembling the metal plate partitions and the housing can be simplified, thereby briefly disassembling and assembling the metal plate partitions.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
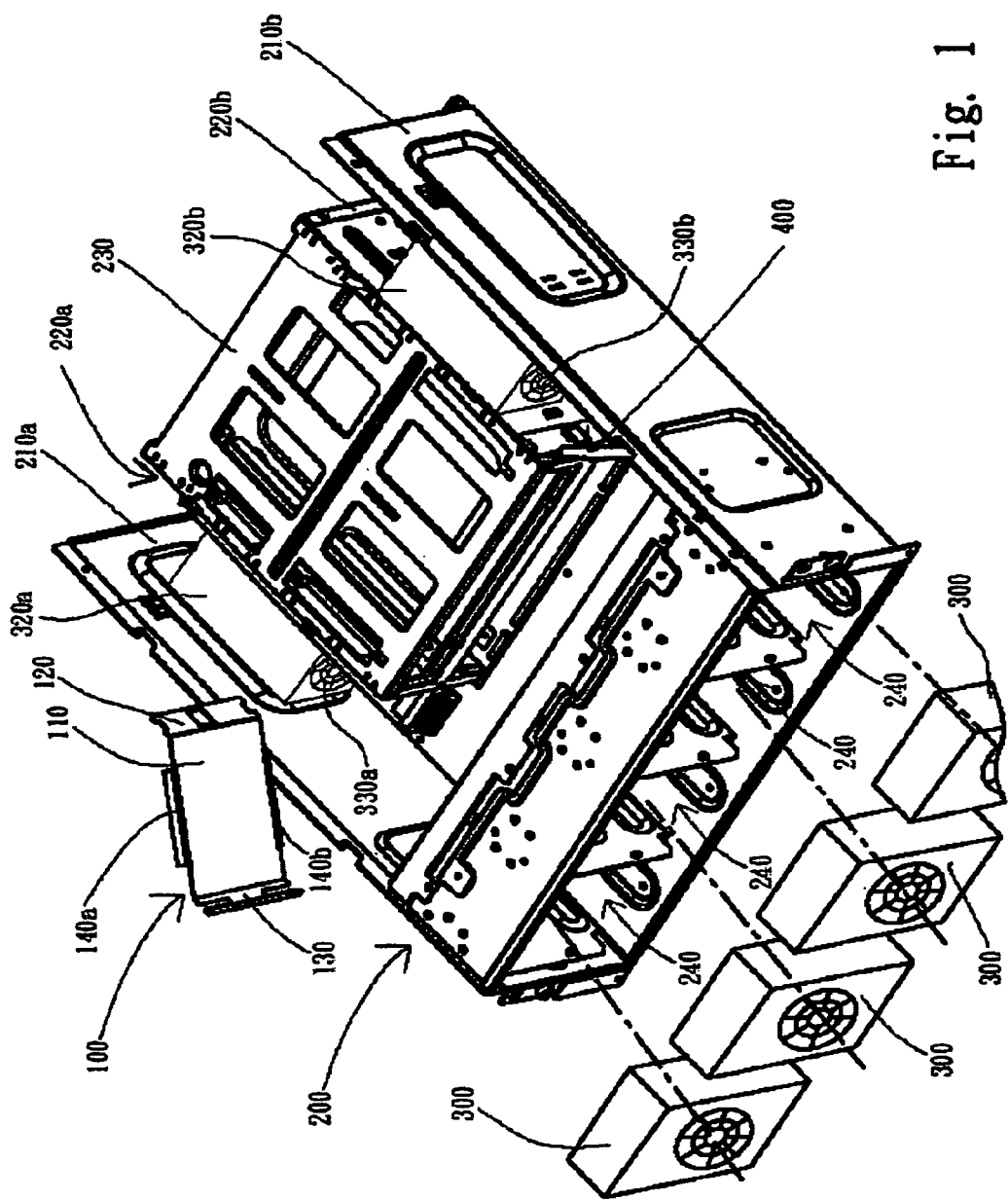
FIG. 1 is a 3-D schematic diagram showing the assembly of system fan modules and an electronic product having an airflow-guiding device, according to a preferred embodiment of the present invention.

Referring to FIG. 1, FIG. 1 is a 3-D schematic diagram showing the assembly of system fan modules and an electronic product having an airflow-guiding device, according to a preferred embodiment of the present invention. The electronic product (such as an industrial computer or a server) of the present invention has a housing body 200, and in the housing body 200, there are an electronic module group 230, at least one power supply (such as two power supplies 320a and 320b), a plurality of system fan modules 300 (such as four system fan modules), and at least one metal plate partition (such as two metal plate partitions; metal plate partitions 100 and 400), wherein the electronic module group 230 is composed of a plurality of electronic modules (such as storage controllers; hard disk drives), and the electronic modules are generally installed in the central position of the housing body 200 with a vertically stacking pattern. A module partition 220a and a module partition 220b are installed between the power supplies 320a and 320b and both sides of the electronic module group 230, and the module partitions 220a and 220b are used for securing the electronic module group 230. One power supply 320a is located in a passage (not labeled) between the electronic module group 230 (or the module partition 220a) and a housing sidewall 210a, and the other power supply 320b is located in a passage (not labeled) between the electronic module group 230 (or the module partition 220b) and a housing sidewall 210b, wherein each of the power supplies 320a and 320b has a fan 330a or 330b installed for dissipating the heat generated therefrom. The system fan modules 300 are located in one end of the housing body 200, and are exposed to the ambience for dissipating the heat generated from the electronic product (ex: electronic module group 230) of the present invention. The metal plate partition 100 and the metal plate partition 400 are identical to each other in shape, size and structure, and are installed on air inlets of the aforementioned passages facing towards the system fan modules 300, whereby the airflow coming from the system fan modules 300 can be prevented from entirely entering the power supplies 320a and 320b, wherein the number of the metal plate partitions is the same as that of the power supplies, such as two. The aforementioned numbers of the metal plate partitions and the power supplies are merely stated as an example for explanation, and can be changed in accordance with actual needs, so that the present invention is not limited thereto.

Since the metal plate partition 100 of the present invention are the same as the metal plate partition 400 thereof in shape, size and structure, and the method for combining the metal plate partition 100 with the housing sidewall 210a and the module partition 220a is also the same as that for combining the metal plate partition 400 with the housing sidewall 210b and the module partition 220b. Therefore, only the metal plate partition 100 is used hereinafter for describing the present invention in detail.

The metal plate partition 100 is composed of a partition main body 110, and folded plates 120 and 130 connected to the partition main body 110. While the metal plate partition 100 blocks an air inlet in front of the power supply 320a, the airflow coming from the system fan modules 300 can be guided into the electronic module group 230. However, the power supply 320a still needs a proper amount of airflow passing through for heat dissipation. Hence, the present invention installs buffer elements 140a and 140b (such as sponge pads) on portions of two opposite sides of the partition main body 110 adjacent to the folded plates 120 and 130, wherein the area of the buffer elements 140a and 140b covering the aforementioned opposite sides determines the gaps between the partition main body 110 and the top/bottom surfaces of the housing body 200, after the upper cover of the housing is placed in position. If the area covered by the buffer elements 140a and 140b is larger, then the aforementioned gaps are smaller, and the amount of airflow entering the power supply 320a is less accordingly. If the area covered by the buffer elements 140a and 140b is smaller, then the aforementioned gaps are bigger, and the amount of airflow entering the power supply 320a is larger accordingly. The folded plate 120 is fixed to the module partition 220a, and the folded plate 130 is fixed to the housing sidewall 210a.

Figure 3:
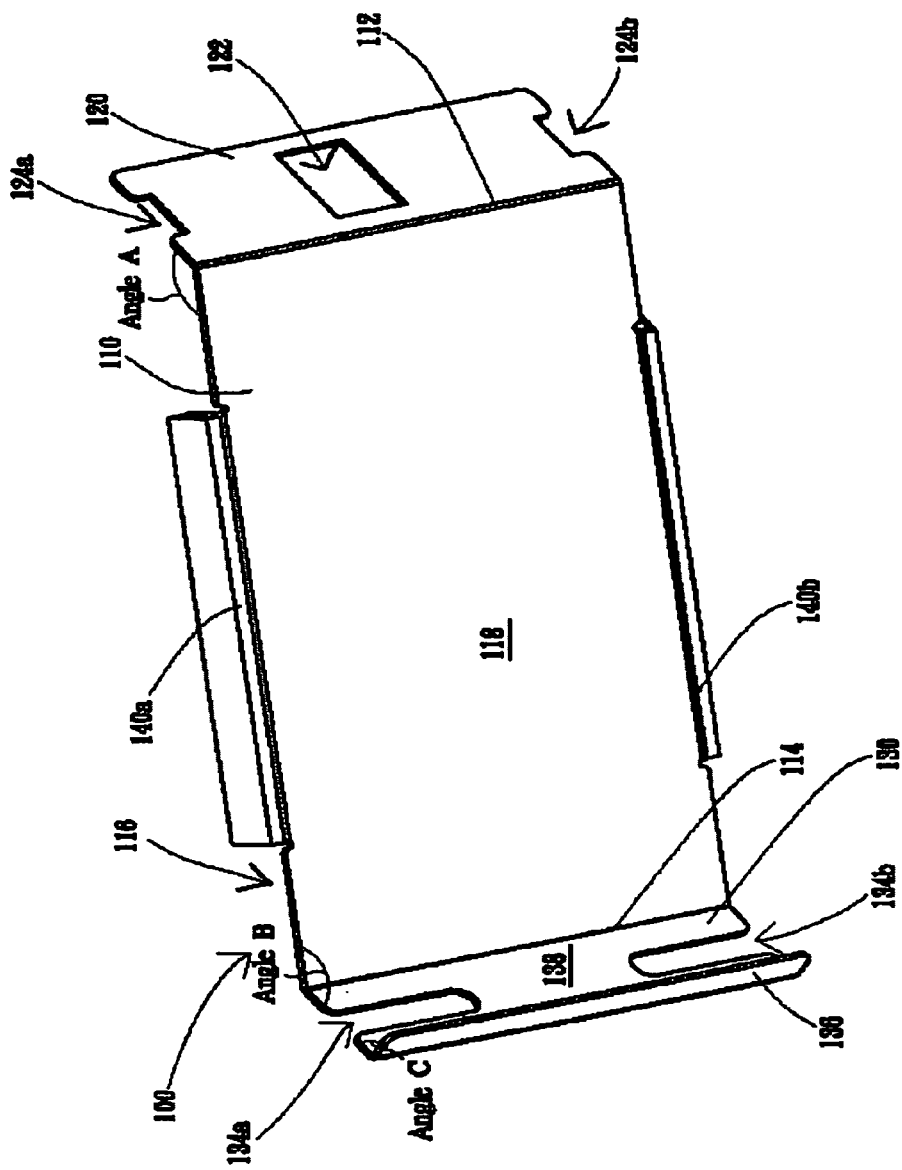
FIG. 3 is a 3-D schematic diagram showing the structure of a metal plate partition used in the preferred embodiment of the present invention.

Referring to FIG. 3, FIG. 3 is a 3-D schematic diagram showing the structure of a metal plate partition used in the preferred embodiment of the present invention. In the metal plate partition 100, the partition main body 110 has two opposite sides 112 and 114, and a lower main surface 116 and an upper main surface 118 that are opposite to each other. The folded plate 120 is connected to the side 112, and there is a folded plate angle A between the folded plate 120 and the lower main surface 116, wherein the folded plate angle A is greater than 0 degrees and smaller than 180 degrees. The folded plate 130 is connected to the side 114, and there is a folded plate angle B between the folded plate 130 and the lower main surface 118, wherein the folded plate angle. B is greater than 0 degrees and smaller than 180 degrees. The folding direction of the folded plate 120 is opposite to that of the folded plate 130. A fin plate 136 is connected to one side of the folded plate 130 opposite to the side 114, and the fin plate 136 is used for conveniently disassembling the folded plate 130, wherein there is a fin plate angle C between the fin plate 136 and a folded plate surface 138 of the folded plate 130 facing towards the partition main body 110, and the fin plate angle C is greater than 0 degrees and smaller than 180 degrees.

Figure 4:
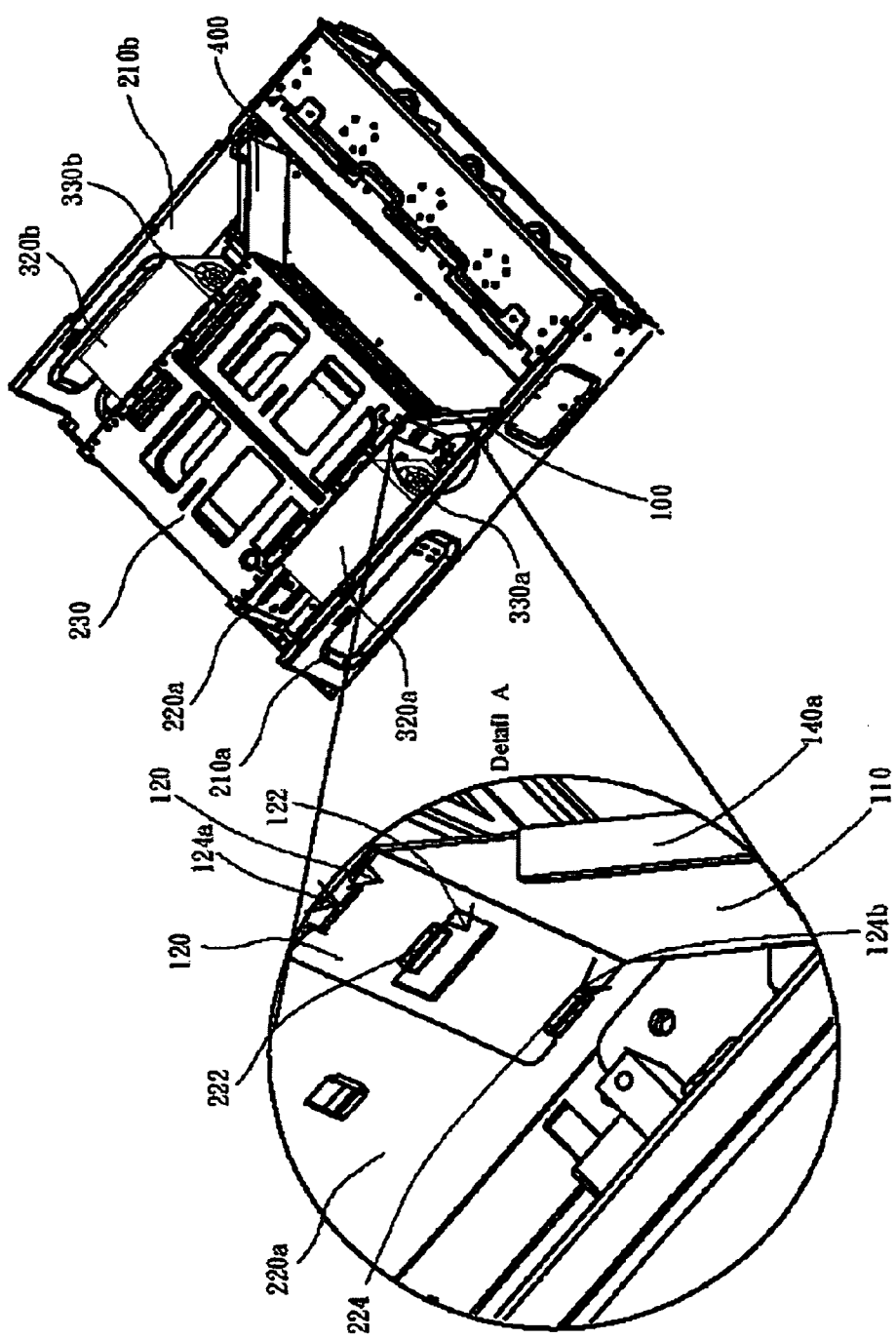
FIG. 4 is a 3-D locally-enlarged schematic view showing the metal plate partition combined with a module sidewall, according to the preferred embodiment of the present invention.

Referring to FIG. 3 and FIG. 4 continuously, FIG. 4 is a 3-D locally-enlarged schematic view showing the metal plate partition combined with a module sidewall, according to the preferred embodiment of the present invention. Such as shown in detail A, the folded plate 120 has an opening 122 and a pair of shallow concaved portions 124a and 124b, wherein the opening 122 is located in the folded plate 120 for engaging with a clipping structure 222 located on the module partition 220a, and the shallow concaved portions 124a and 124b are located on two sides of the folded plate 120 adjacent to the partition main body 110, wherein one of the shallow concaved portions 124a and 124b is used to engage with a clipping structure 224 located on the module partition 220a.

Figure 2:
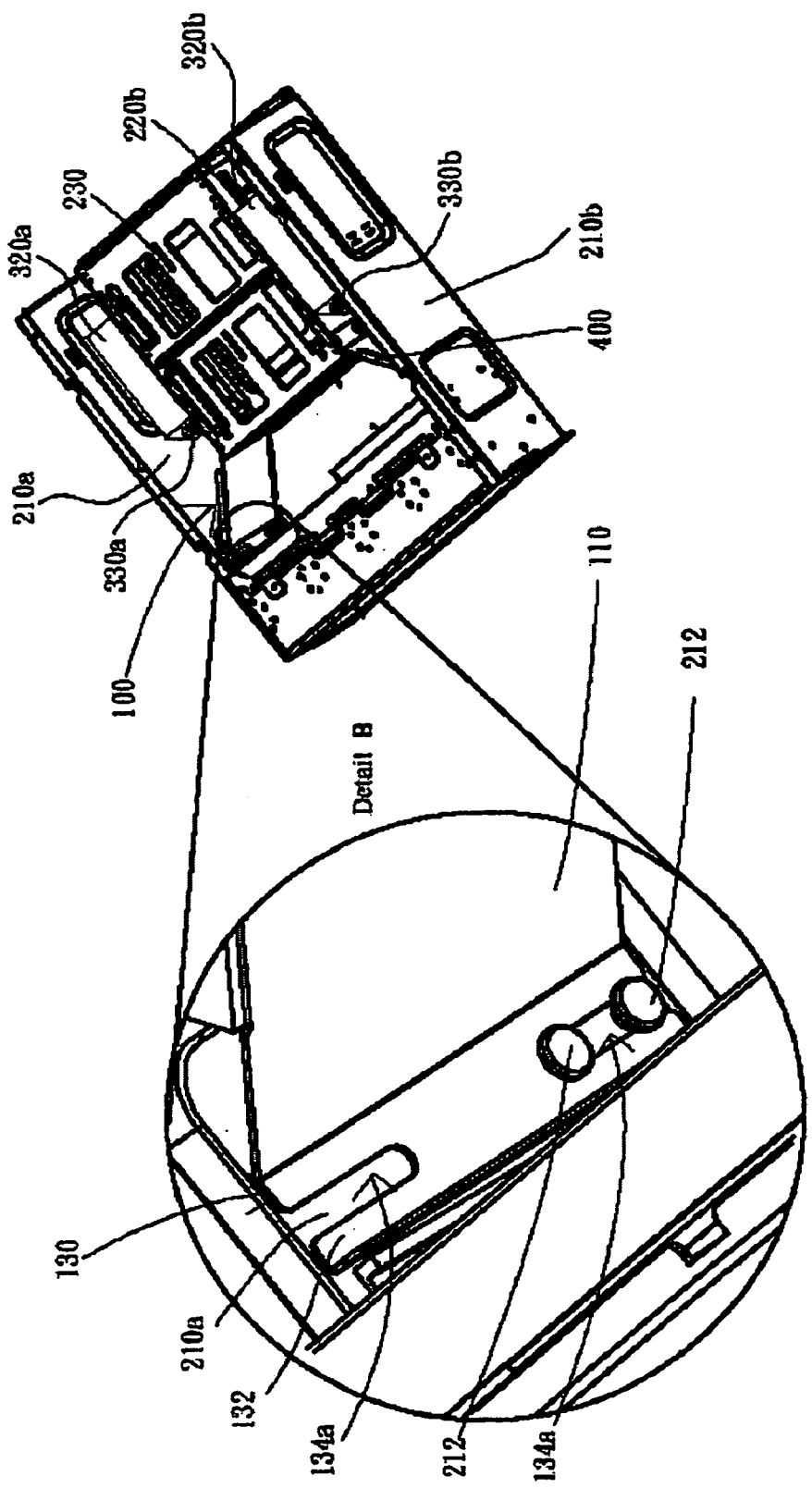
FIG. 2 is a 3-D locally-enlarged schematic view showing the metal plate partition combined with a sidewall of the housing body, according to the preferred embodiment of the present invention.

Referring to FIG. 3 and FIG. 2 continuously, FIG. 2 is a 3-D locally-enlarged schematic view showing the metal plate partition combined with a sidewall of the housing body, according to the preferred embodiment of the present invention. Such as shown in detail B, the folded plate 130 has a pair of deep concaved portions 134a and 134b. The deep concaved portions 134a and 134b are located respectively on two sides of the folded plate 130 adjacent to the partition main body 110, wherein one of the deep concaved portions 134a and 134b (such as the deep concaved portion 134b) is used to engage with at least one guiding pillar 212 located in the housing sidewall 210a. The number of the guiding pillars 212 can be such as two, and the structure thereof can be similar to a screw.

One of the features of the present invention is to use metal plate material for fabricating an airflow-guiding device (the metal plate partitions 100 and 400). Using the metal plate material has the advantages of no molding expense needed and easy processing, and only a pressing method is needed for processing the metal plate material, so as to complete the fabrication of the airflow-guiding device for the present invention. In comparison to the conventional plastic windshielding partition, the airflow-guiding device of the present invention can be easily processed with a design change. Further, since the present invention uses the guiding pillars, the clipping structures, the concaved portions and the openings to fix the metal plate partitions to the housing body and the module partitions, the metal plate partitions can be disassembled or assembled easily and only by moving the fin plates of the metal plate partitions without using other screw elements.

It can be known from the aforementioned preferred embodiment of the present invention, the advantages of applying the present invention are: greatly reducing the fabrication cost of partitions, and lowering the difficulty level of processing a design change; effectively and flexibly distributing airflow, thus greatly enhancing the airflow-guiding effect; and greatly simplifying the mechanism for assembling the metal plate partitions and the housing, thereby briefly disassembling and assembling the metal plate partitions.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. An electronic product having an airflow-guiding device, comprising:
   a housing body;
   an electronic module group, located in said housing body;
   at least one power supply, located in a passage between said electronic module group and said housing body, wherein a fan is installed on said power supply for providing the heat-dissipation function for said power supply;
   at least one system fan module, located on one end of said the housing body for introducing the ambient airflow into said housing body, thereby providing the heat-dissipation function for said electronic module group; and
   at least one metal plate partition, installed on an air inlet of said passage facing towards said system fan module, thereby reducing the air flowing from said system fan module into said power supply.

2. The electronic product of claim 1, wherein said metal plate partition comprises:
   a partition main body, having a first side and a second side opposite to said first side, and a first main surface and a second main surface opposite to said firs main surface; and
   a first folded plate and a second folded plate, respectively connected to said first side and said second side, wherein said first folded plate is fixed to a module sidewall of said electronic module group, and said second folded plate is fixed to a housing sidewall of said housing body, and there is a first folded plate angle between said first folded plate and said first main surface, and there is a second folded plate angle between said second folded plate and said second main surface, wherein said first folded plate angle and said second folded plate angle each are greater than 0 degrees and smaller than 180 degrees.

3. The electronic product of claim 2, wherein said metal plate partition comprises:
   a fin plate, connected to one side of said second folded plate opposite to said second side for conveniently disassembling said second folded plate, wherein there is a fin plate angle between said fin plate and a folded plate surface of said second folded plate facing towards said partition main body, wherein said fin plate angle is greater than 0 degrees and smaller than 180 degrees.

4. The electronic product of claim 2, wherein said metal plate partition comprises:
   at least one buffer element, covering portions of two opposite sides of said partition main body adjacent to said first side and said second side, thereby allowing a proper amount of air to flow into said power supply.

5. The electronic product of claim 4, wherein said buffer element is a sponge pad.

6. The electronic product of claim 2, wherein said first folded plate has an opening and a pair of shallow concaved portions, wherein said opening is located in said first folded plate for engaging with a first clipping structure located on said module sidewall, and said shallow concaved portions are located respectively on two sides of said first folded plate adjacent to said partition main body, wherein one of said shallow concaved portions is used to engage with a second clipping structure located on said module sidewall.

7. The electronic product of claim 2, wherein said second folded plate has a pair of deep concaved portions located respectively on two sides of said second folded plate adjacent to said partition main body, wherein one of said deep concaved portions is used to engage with at least one guiding pillar located on said housing sidewall.

8. The electronic product of claim 7, wherein the structure of said guiding pillar is similar to a screw.

9. The electronic product of claim 1, wherein the number of said metal plate partition is the same as the number of said power supply.

10. The electronic product of claim 1, having two pieces of said metal plate partition which are identical in shape, size and structure.

11. The electronic product of claim 1, wherein said module sidewall is a module partition located between said electronic module group and said power supply for securing said electronic module group.

12. A computer having an airflow-guiding device, comprising:
a housing body, wherein said housing body has:
at least one guiding pillar, located on a housing sidewall of said housing body;
an electronic module group, located in said housing body, wherein said electronic module group has:
at least one module sidewall, wherein said at least module sidewall has a first clipping structure and a second clipping structure;
at least one power supply, located in said housing body, and located in a passage between said module sidewall and said housing body, wherein a fan is installed on said power supply for providing the heat-dissipation function for said power supply;
at least one system fan module, located on one end of said the housing body for introducing the ambient airflow into said housing body, thereby providing the heat-dissipation function for said electronic module group; and
at least one metal plate partition, installed on an air inlet of said passage facing towards said system fan module, thereby reducing the air flowing from said system fan module into said power supply, wherein said metal plate partition comprises:
a partition main body, having a first side and a second side opposite to said first side, and a first main surface and a second main surface opposite to said firs main surface;
a first folded plate, connected to said first side, wherein said first folded plate is fixed to said module sidewall of said electronic module group, and there is a first folded plate angle between said first folded plate and said first main surface, and said first folded plate angle is greater than 0 degrees and smaller than 180 degrees, said first folded plate having:
an opening and a pair of shallow concaved portions, wherein said opening is located in said first folded plate for engaging with said first clipping structure, and said shallow concaved portions are located respectively on two sides of said first folded plate adjacent to said partition main body, wherein one of said shallow concaved portions is used to engage with said second clipping structure; and
a second folded plate, connected to said second side, wherein said second folded plate is fixed to said housing sidewall, and there is a second folded plate angle between said second folded plate and said second main surface, wherein said second folded plate angle each are greater than 0 degrees and smaller than 180 degrees, said second folded plate having:
a pair of deep concaved portions, respectively located on two sides of said second folded plate adjacent to said partition main body, wherein one of said deep concaved portions is used to engage with said guiding pillar.

13. The computer of claim 12, wherein said metal plate partition comprises:
a fin plate, connected to one side of said second folded plate opposite to said second side for conveniently disassembling said second folded plate, wherein there is a fin plat angle between said fin plate and a folded plate surface of said second folded plate facing towards said partition main body, wherein said fin plate angle is greater than 0 degrees and smaller than 180 degrees.

14. The computer of claim 12, wherein said e metal plate partition comprises:
at least one buffer element, covering portions of two opposite sides of said partition main body adjacent to said first side and said second side, thereby allowing a proper amount of air to flow into said power supply.

15. The computer of claim 14, wherein said buffer element is a sponge pad.

16. The computer of claim 12, wherein the structure of said guiding pillar is similar to a screw.

17. The computer of claim 12, wherein the number of said metal plate partition is the same as the number of said power supply.

18. The computer of claim 12, having two pieces of said metal plate partition which are identical in shape, size and structure.

19. The computer of claim 12, wherein said module sidewall is a module partition located between said electronic module group and said power supply for securing said electronic module group.

20. The computer of claim 12, wherein said electronic module group comprises a hard disk drive.

* * * * *